United States Patent
Mohammed

(10) Patent No.: US 9,685,365 B2
(45) Date of Patent: Jun. 20, 2017

(54) METHOD OF FORMING A WIRE BOND HAVING A FREE END

(71) Applicant: Invensas Corporation, San Jose, CA (US)

(72) Inventor: Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 400 days.

(21) Appl. No.: 13/962,332

(22) Filed: Aug. 8, 2013

(65) Prior Publication Data

US 2015/0044823 A1 Feb. 12, 2015

(51) Int. Cl.
*H01R 43/02* (2006.01)
*H01L 21/768* (2006.01)
(Continued)

(52) U.S. Cl.
CPC ........ *H01L 21/768* (2013.01); *H01L 21/4853* (2013.01); *H01L 21/4885* (2013.01); *H01L 21/56* (2013.01); *H01L 23/49811* (2013.01); *H01L 23/3121* (2013.01); *H01L 2224/0401* (2013.01); *H01L 2224/16227* (2013.01);
(Continued)

(58) Field of Classification Search
CPC ............ H01L 21/4853; H01L 21/4889; H01L 21/4896; H01L 21/768; Y10T 29/49002; Y10T 29/49117; Y10T 29/4914; Y10T 29/49169; Y10T 29/49181; Y10T 29/48218

USPC ................ 29/857, 860, 863, 876, 872, 884; 438/126, 597
See application file for complete search history.

(56) References Cited

U.S. PATENT DOCUMENTS 3,289,452 A 12/1966 Koellner
3,358,897 A 12/1967 Christensen
(Continued)

FOREIGN PATENT DOCUMENTS

CN 1352804 A 6/2002
CN 1641832 A 7/2005
(Continued)

OTHER PUBLICATIONS

International Search Report and Written Opinion for Application No. PCT/US2014/050148 dated Feb. 9, 2015.
(Continued)

*Primary Examiner* — Paul D Kim
(74) *Attorney, Agent, or Firm* — Lerner, David, Littenberg, Krumholz & Mentlik, LLP

(57) ABSTRACT

A method of forming a wire bond having a free end includes joining an end of a metal wire to a conductive element at a surface of a first component, the end of the metal wire being proximate a surface of a bonding tool adjacent an aperture through which the metal wire extends. A predetermined length of the metal wire is drawn out from the aperture. The surface of the bonding tool is used to plastically deform a region of the metal wire between the surface of the bonding tool and a metal element at the surface of the first component. The bonding tool then applies tension to the metal wire to cause a first portion of the metal wire having the end joined to the conductive element to detach from a remaining portion of the metal wire at the plastically deformed region.

23 Claims, 7 Drawing Sheets

(51) Int. Cl.
*H01L 21/56* (2006.01)
*H01L 23/498* (2006.01)
*H01L 21/48* (2006.01)
*H01L 23/31* (2006.01)

(52) U.S. Cl.
CPC .............. *H01L 2224/32225* (2013.01); *H01L 2224/48227* (2013.01); *H01L 2224/73204* (2013.01); *H01L 2224/78301* (2013.01); *H01L 2924/19107* (2013.01)

(56) References Cited

U.S. PATENT DOCUMENTS

| | | | |
|---|---|---|---|
| 3,430,835 A * | 3/1969 | Patzer et al. | 228/4.1 |
| 3,623,649 A | 11/1971 | Keisling | |
| 3,795,037 A | 3/1974 | Luttmer | |
| 3,900,153 A | 8/1975 | Beerwerth et al. | |
| 4,067,104 A | 1/1978 | Tracy | |
| 4,213,556 A * | 7/1980 | Persson et al. | 228/104 |
| 4,327,860 A * | 5/1982 | Kirshenboin et al. | 228/180.5 |
| 4,422,568 A | 12/1983 | Elles et al. | |
| 4,437,604 A | 3/1984 | Razon et al. | |
| 4,604,644 A | 8/1986 | Beckham et al. | |
| 4,642,889 A | 2/1987 | Grabbe | |
| 4,695,870 A | 9/1987 | Patraw | |
| 4,716,049 A | 12/1987 | Patraw | |
| 4,771,930 A | 9/1988 | Gillotti et al. | |
| 4,793,814 A | 12/1988 | Zifcak et al. | |
| 4,804,132 A | 2/1989 | DiFrancesco | |
| 4,845,354 A | 7/1989 | Gupta et al. | |
| 4,902,600 A | 2/1990 | Tamagawa et al. | |
| 4,924,353 A | 5/1990 | Patraw | |
| 4,925,083 A * | 5/1990 | Farassat et al. | 228/102 |
| 4,955,523 A | 9/1990 | Carlommagno et al. | |
| 4,975,079 A | 12/1990 | Beaman et al. | |
| 4,982,265 A | 1/1991 | Watanabe et al. | |
| 4,998,885 A | 3/1991 | Beaman | |
| 4,999,472 A | 3/1991 | Neinast et al. | |
| 5,067,007 A | 11/1991 | Otsuka et al. | |
| 5,067,382 A | 11/1991 | Zimmerman et al. | |
| 5,083,697 A | 1/1992 | Difrancesco | |
| 5,095,187 A | 3/1992 | Gliga | |
| 5,133,495 A | 7/1992 | Angulas et al. | |
| 5,138,438 A | 8/1992 | Masayuki et al. | |
| 5,148,265 A | 9/1992 | Khandros et al. | |
| 5,148,266 A | 9/1992 | Khandros et al. | |
| 5,186,381 A | 2/1993 | Kim | |
| 5,189,505 A | 2/1993 | Bartelink | |
| 5,196,726 A | 3/1993 | Nishiguchi et al. | |
| 5,203,075 A | 4/1993 | Angulas et al. | |
| 5,214,308 A | 5/1993 | Nishiguchi et al. | |
| 5,220,489 A | 6/1993 | Barreto et al. | |
| 5,222,014 A | 6/1993 | Lin | |
| 5,238,173 A * | 8/1993 | Ura et al. | 228/104 |
| 5,241,456 A | 8/1993 | Marcinkiewicz et al. | |
| 5,316,788 A | 5/1994 | Dibble et al. | |
| 5,340,771 A | 8/1994 | Rostoker | |
| 5,346,118 A | 9/1994 | Degani et al. | |
| 5,371,654 A | 12/1994 | Beaman et al. | |
| 5,397,997 A | 3/1995 | Tuckerman et al. | |
| 5,438,224 A | 8/1995 | Papageorge et al. | |
| 5,455,390 A | 10/1995 | DiStefano et al. | |
| 5,468,995 A | 11/1995 | Higgins, III | |
| 5,494,667 A | 2/1996 | Uchida et al. | |
| 5,495,667 A | 3/1996 | Farnworth et al. | |
| 5,518,964 A | 5/1996 | DiStefano et al. | |
| 5,531,022 A | 7/1996 | Beaman et al. | |
| 5,536,909 A | 7/1996 | DiStefano et al. | |
| 5,541,567 A | 7/1996 | Fogel et al. | |
| 5,571,428 A | 11/1996 | Nishimura et al. | |
| 5,608,265 A | 3/1997 | Kitano et al. | |
| 5,615,824 A | 4/1997 | Fjelstad et al. | |
| 5,635,846 A | 6/1997 | Beaman et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,688,716 A | 11/1997 | DiStefano et al. | |
| 5,718,361 A | 2/1998 | Braun et al. | |
| 5,726,493 A | 3/1998 | Yamashita et al. | |
| 5,731,709 A | 3/1998 | Pastore et al. | |
| 5,736,780 A | 4/1998 | Murayama | |
| 5,766,987 A | 6/1998 | Mitchell et al. | |
| 5,787,581 A | 8/1998 | DiStefano et al. | |
| 5,801,441 A | 9/1998 | DiStefano et al. | |
| 5,802,699 A | 9/1998 | Fjelstad et al. | |
| 5,811,982 A | 9/1998 | Beaman et al. | |
| 5,821,763 A | 10/1998 | Beaman et al. | |
| 5,830,389 A | 11/1998 | Capote et al. | |
| 5,831,836 A | 11/1998 | Long et al. | |
| 5,839,191 A | 11/1998 | Economy et al. | |
| 5,854,507 A | 12/1998 | Miremadi et al. | |
| 5,898,991 A | 5/1999 | Fogel et al. | |
| 5,908,317 A | 6/1999 | Heo | |
| 5,912,505 A | 6/1999 | Itoh et al. | |
| 5,948,533 A | 9/1999 | Gallagher et al. | |
| 5,953,624 A | 9/1999 | Bando et al. | |
| 5,971,253 A | 10/1999 | Gilleo et al. | |
| 5,973,391 A | 10/1999 | Bischoff et al. | |
| 5,977,618 A | 11/1999 | DiStefano et al. | |
| 5,980,270 A | 11/1999 | Fjelstad et al. | |
| 5,989,936 A | 11/1999 | Smith et al. | |
| 5,994,152 A | 11/1999 | Khandros et al. | |
| 6,000,126 A | 12/1999 | Pai | |
| 6,002,168 A | 12/1999 | Bellaar et al. | |
| 6,032,359 A | 3/2000 | Carroll | |
| 6,038,136 A | 3/2000 | Weber | |
| 6,052,287 A | 4/2000 | Palmer et al. | |
| 6,054,337 A | 4/2000 | Solberg | |
| 6,054,756 A | 4/2000 | DiStefano et al. | |
| 6,077,380 A | 6/2000 | Hayes et al. | |
| 6,117,694 A | 9/2000 | Smith et al. | |
| 6,121,676 A | 9/2000 | Solberg | |
| 6,124,546 A | 9/2000 | Hayward et al. | |
| 6,133,072 A | 10/2000 | Fjelstad | |
| 6,145,733 A | 11/2000 | Streckfuss et al. | |
| 6,157,080 A | 12/2000 | Tamaki et al. | |
| 6,158,647 A | 12/2000 | Chapman et al. | |
| 6,164,523 A | 12/2000 | Fauty et al. | |
| 6,168,965 B1 | 1/2001 | Malinovich et al. | |
| 6,177,636 B1 | 1/2001 | Fjelstad | |
| 6,180,881 B1 | 1/2001 | Isaak | |
| 6,194,250 B1 | 2/2001 | Melton et al. | |
| 6,194,291 B1 | 2/2001 | DiStefano et al. | |
| 6,202,297 B1 | 3/2001 | Faraci et al. | |
| 6,206,273 B1 | 3/2001 | Beaman et al. | |
| 6,208,024 B1 | 3/2001 | DiStefano | |
| 6,211,572 B1 | 4/2001 | Fjelstad et al. | |
| 6,211,574 B1 | 4/2001 | Tao et al. | |
| 6,215,670 B1 | 4/2001 | Khandros | |
| 6,218,728 B1 | 4/2001 | Kimura | |
| 6,225,688 B1 | 5/2001 | Kim et al. | |
| 6,258,625 B1 | 7/2001 | Brofman et al. | |
| 6,260,264 B1 | 7/2001 | Chen et al. | |
| 6,262,482 B1 | 7/2001 | Shiraishi et al. | |
| 6,268,662 B1 | 7/2001 | Test et al. | |
| 6,295,729 B1 * | 10/2001 | Beaman et al. | 29/843 |
| 6,300,780 B1 | 10/2001 | Beaman et al. | |
| 6,303,997 B1 | 10/2001 | Lee | |
| 6,313,528 B1 | 11/2001 | Solberg | |
| 6,316,838 B1 | 11/2001 | Ozawa et al. | |
| 6,329,224 B1 | 12/2001 | Nguyen et al. | |
| 6,332,270 B2 | 12/2001 | Beaman et al. | |
| 6,334,247 B1 | 1/2002 | Beaman et al. | |
| 6,358,627 B2 | 3/2002 | Benenati et al. | |
| 6,362,520 B2 | 3/2002 | DiStefano | |
| 6,362,525 B1 | 3/2002 | Rahim | |
| 6,376,769 B1 | 4/2002 | Chung | |
| 6,388,333 B1 | 5/2002 | Taniguchi et al. | |
| 6,399,426 B1 | 6/2002 | Capote et al. | |
| 6,407,448 B2 | 6/2002 | Chun | |
| 6,413,850 B1 | 7/2002 | Ooroku et al. | |
| 6,439,450 B1 | 8/2002 | Chapman et al. | |
| 6,458,411 B1 | 10/2002 | Goossen et al. | |
| 6,476,503 B1 | 11/2002 | Imamura et al. | |

(56) References Cited

U.S. PATENT DOCUMENTS

| | | |
|---|---|---|
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B2 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,268,421 B1 | 9/2007 | Lin |
| 7,276,799 B2 | 10/2007 | Lee et al. |
| 7,294,920 B2 | 11/2007 | Chen et al. |
| 7,294,928 B2 | 11/2007 | Bang et al. |
| 7,323,767 B2 | 1/2008 | James et al. |
| 7,344,917 B2 | 3/2008 | Gautham |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,857,190 B2 * | 12/2010 | Takahashi et al. ........... 228/102 |
| 7,880,290 B2 | 2/2011 | Park |
| 7,892,889 B2 | 2/2011 | Howard et al. |
| 7,902,644 B2 | 3/2011 | Huang et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,970 B2 | 10/2011 | Yamamori et al. |
| 8,053,879 B2 | 11/2011 | Lee et al. |
| 8,058,101 B2 | 11/2011 | Haba et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,084,867 B2 | 12/2011 | Tang et al. |
| 8,092,734 B2 | 1/2012 | Jiang et al. |

(56) References Cited

U.S. PATENT DOCUMENTS

| | | |
|---|---|---|
| 8,093,697 B2 | 1/2012 | Haba et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,299,368 B2 | 10/2012 | Endo |
| 8,304,900 B2 | 11/2012 | Jang et al. |
| 8,314,492 B2 | 11/2012 | Egawa |
| 8,319,338 B1 | 11/2012 | Berry et al. |
| 8,372,741 B1 | 2/2013 | Co et al. |
| 8,404,520 B1 | 3/2013 | Chau et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 | 12/2013 | Sato et al. |
| 8,659,164 B2 | 2/2014 | Haba |
| 8,680,684 B2 | 3/2014 | Haba et al. |
| 8,728,865 B2 | 5/2014 | Haba et al. |
| 8,836,136 B2 | 9/2014 | Chau et al. |
| 8,878,353 B2 | 11/2014 | Haba et al. |
| 8,907,466 B2 | 12/2014 | Haba |
| 8,927,337 B2 | 1/2015 | Haba et al. |
| 8,987,132 B2 | 3/2015 | Gruber et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,123,664 B2 | 9/2015 | Haba |
| 9,136,254 B2 | 9/2015 | Zhao et al. |
| 9,153,562 B2 | 10/2015 | Haba et al. |
| 9,224,717 B2 | 12/2015 | Sato et al. |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0139893 A1 | 6/2006 | Yoshimura et al. |
| 2006/0166397 A1 | 7/2006 | Lau et al. |
| 2006/0197220 A1 | 9/2006 | Beer |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0013067 A1 | 1/2007 | Nishida et al. |
| 2007/0015353 A1 | 1/2007 | Craig et al. |
| 2007/0035015 A1 | 2/2007 | Hsu |
| 2007/0045803 A1 | 3/2007 | Ye et al. |
| 2007/0090524 A1 | 4/2007 | Abbott |
| 2007/0126091 A1 | 6/2007 | Wood et al. |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |

(56) References Cited

U.S. PATENT DOCUMENTS

| | | |
|---|---|---|
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0211084 A1 | 9/2008 | Chow et al. |
| 2008/0230887 A1 | 9/2008 | Sun et al. |
| 2008/0277772 A1 | 11/2008 | Groenhuis et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1 | 2/2009 | Jiang et al. |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0121351 A1 | 5/2009 | Endo |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1 | 9/2009 | Lee et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2009/0316378 A1 | 12/2009 | Haba et al. |
| 2010/0000775 A1 | 1/2010 | Shen et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0148374 A1 | 6/2010 | Castro |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0057308 A1 | 3/2011 | Choi et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0175213 A1 | 7/2011 | Mori et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0007232 A1 | 1/2012 | Haba |
| 2012/0015481 A1 | 1/2012 | Kim |
| 2012/0018885 A1 | 1/2012 | Lee et al. |
| 2012/0020026 A1 | 1/2012 | Oganesian et al. |
| 2012/0025365 A1 | 2/2012 | Haba |
| 2012/0034777 A1 | 2/2012 | Pagaila et al. |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0104595 A1 | 5/2012 | Haba et al. |
| 2012/0104624 A1 | 5/2012 | Choi et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2012/0326337 A1 | 12/2012 | Camacho et al. |
| 2013/0032944 A1 | 2/2013 | Sato et al. |
| 2013/0037802 A1 | 2/2013 | England et al. |
| 2013/0049218 A1 | 2/2013 | Gong et al. |
| 2013/0049221 A1 | 2/2013 | Han et al. |
| 2013/0069222 A1 | 3/2013 | Camacho |
| 2013/0082399 A1 | 4/2013 | Kim et al. |
| 2013/0093087 A1 | 4/2013 | Chau et al. |
| 2013/0093088 A1 | 4/2013 | Chau et al. |
| 2013/0095610 A1 | 4/2013 | Chau et al. |
| 2013/0105979 A1 | 5/2013 | Yu et al. |
| 2013/0134588 A1 | 5/2013 | Yu et al. |
| 2013/0182402 A1 | 7/2013 | Chen et al. |
| 2013/0200533 A1 | 8/2013 | Chau et al. |
| 2013/0234317 A1 | 9/2013 | Chen et al. |
| 2013/0241083 A1 | 9/2013 | Yu et al. |
| 2014/0021605 A1 | 1/2014 | Yu et al. |
| 2014/0036454 A1 | 2/2014 | Caskey et al. |
| 2014/0124949 A1 | 5/2014 | Paek et al. |
| 2014/0220744 A1 | 8/2014 | Damberg et al. |
| 2014/0264945 A1 | 9/2014 | Yap et al. |
| 2015/0017765 A1 | 1/2015 | Co et al. |
| 2015/0044823 A1 | 2/2015 | Mohammed |

FOREIGN PATENT DOCUMENTS

| | | |
|---|---|---|
| CN | 1877824 A | 12/2006 |
| CN | 101409241 A | 4/2009 |

(56) References Cited

FOREIGN PATENT DOCUMENTS

| | | |
|---|---|---|
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 11317476 | 11/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 200447702 | 2/2004 |
| JP | 2004-172157 A | 6/2004 |
| JP | 2004281514 A | 10/2004 |
| JP | 2004-319892 | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 | 12/2007 |
| JP | 2007335464 A | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009528706 A | 8/2009 |
| JP | 2009260132 A | 11/2009 |
| JP | 2010103129 A | 5/2010 |
| JP | 2010192928 | 9/2010 |
| JP | 2010199528 A | 9/2010 |
| JP | 2010206007 A | 9/2010 |
| KR | 100265563 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2010041630 A1 | 4/2010 |
| WO | 2010101163 A1 | 9/2010 |
| WO | 2013059181 A1 | 4/2013 |
| WO | 2013065895 A1 | 5/2013 |
| WO | 2014107301 A1 | 7/2014 |

OTHER PUBLICATIONS

In, Yonggang et al., "STM 3D-IC Package and 3D eWLB Development," STMicroelectronics Singapore/ STMicroelectronics France May 21, 2010.
Office Action from U.S. Appl. No. 12/769,930 mailed May 5, 2011.
Partial International Search Report for Application No. PCT/US2014/014181 dated May 8, 2014.
International Search Report and Written Opinion for Application No. PCT/US2014/014181 dated Jun. 13, 2014.
Taiwanese Office Action for Application No. 103103350 dated Mar. 21, 2016.
U.S. Appl. No. 13/477,532 filed May 22, 2012.
International Search Report and Written Opinion for Application No. PCT/US2014/050125 dated Feb. 4, 2015.
Written Opinion for Application No. PCT/US2014/050125 dated Jul. 15, 2015.
International Search Report and Written Opinion for Application No. PCT/US2014/055695 dated Mar. 20, 2015.
International Preliminary Report on Patentability, Chapter II, for Application No. PCT/US2014/055695 dated Dec. 15, 2015.
Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages (2008).
International Search Report, PCT/US2005/039716, Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2003.

(56) References Cited

OTHER PUBLICATIONS

International Search Report and Written Opinion for Application No. PCT/US2011/044346 dated May 11, 2012.
Partial International Search Report from Invitation to Pay Additional Fees for Application No. PCT/US2012/028738 dated Jun. 6, 2012.
Korean Office Action for Application No. 10-2011-0041843 dated Jun. 20, 2011.
"EE Times Asia" [online]. [Retrieved Aug. 5, 2010]. Retrieved from internet. <http://www.eetasia.com/ ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, Stats ChipPAC LTD.
Search Report from Korean Patent Application No. 10-2010-0113271 dated Jan. 12, 2011.
International Search Report and Written Opinion for PCT/US2011/060551 dated Apr. 18, 2012.
Meiser S, "Klein UND Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
International Search Report and Written Opinion for Application No. PCT/US2011/024143 dated Jan. 17, 2012.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Chinese Office Action for Application No. 201310264264.3 dated May 12, 2015.
Partial International Search Report for Application No. PCT/US2015/033004 dated Sep. 9, 2015.
Taiwanese Office Action for Application No. 102106326 dated Sep. 18, 2015.

* cited by examiner

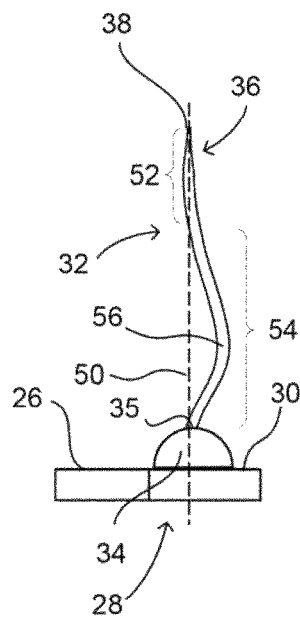 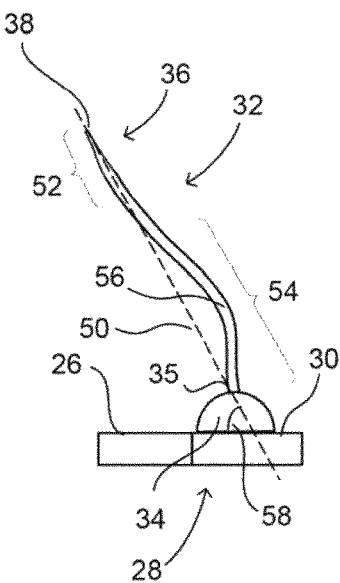 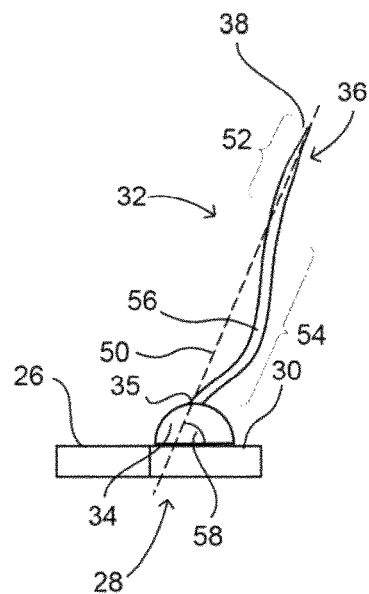
FIG. 10A  FIG. 10B  FIG. 10C
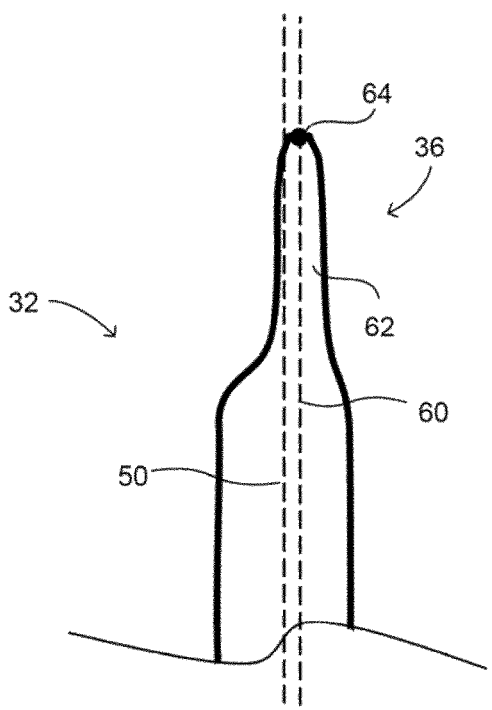
FIG. 11

METHOD OF FORMING A WIRE BOND HAVING A FREE END

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnection distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited. Various packages have been developed that use wire bonds to replace the elongated posts or pins used to interconnect microelectronic packages. However the speed and accuracy with which such wire bonds are formed has presented challenges, particularly with respect to consistent height and positioning of the ends of the wire bonds.

BRIEF SUMMARY OF THE INVENTION

An aspect of the present disclosure relates to a method of forming a wire bond having a free end. The method includes joining an end of a metal wire to a conductive element at a surface of a first component, the end of the metal wire being proximate a surface of a bonding tool adjacent an aperture through which the metal wire extends, and drawing a predetermined length of the metal wire out from the aperture. Then, the surface of the bonding tool is used to plastically deform a region of the metal wire between the surface and a metal element at the surface of the first component. The method then includes using the bonding tool to apply tension to the metal wire to cause a first portion of the metal wire having the end joined to the conductive element to detach from a remaining portion of the metal wire at the plastically deformed region with the first portion forming a wire bond extending from the joined end to a free end of the wire bond remote from the conductive element.

In an example, the metal element can be a portion of a conductive circuit structure included within the first component. The portion of the conductive circuit structure is selected from at least one of a trace, a pad, a plating, line, a power plane, and a ground plane.

The bonding tool can be a capillary and the surface can be a face of the capillary. In an example, the bonding tool can be a bonding wedge and the surface can be a face of the bonding wedge.

The method can further include moving the bonding tool to a position over the metal element such that a portion of the length of wire is between the surface and the metal element.

The movement of the bonding tool can then for a first bend in a portion of the wire between the surface and the joined end. After the step of applying pressure, the method can include moving the bonding tool to a predetermined position approximating a desired position of the free end of the wire bond, thereby forming a second bend in a portion of the wire bond adjacent the joined end. The step of applying tension can cause at least partial straightening of the first bend. In a further example, the steps of applying pressure and applying tension can impart a shape on the wire bond such that the wire bond defines an axis between the free end and the base, the wire bond being bent to extend away from the axis on a plane, the entire wire bond being substantially positioned on the plane on a single side of the axis.

The plastically deformed region of the metal wire can defines an axis that is displaced from an axis of an adjacent portion of the wire in at least one direction.

The conductive element can be one of a plurality of conductive elements at the surface of the substrate and the metal element can be one of a plurality of metal elements at the surface of the substrate. In such an example, the step of applying tension can form another end on the remaining portion of the wire, and the method can include repeating the steps of joining, drawing, plastically deforming, and applying tension to form a plurality of wire bonds extending away from at least some of the conductive elements to respective free ends remote from the conductive elements. Such a method can further include forming a dielectric encapsulation layer so as to at least partially cover the surface of the substrate and portions of the wire bonds such that unencapsulated portions of the wire bonds are defined by at least the ends of the wire bonds that are uncovered by the encapsulation layer.

Another aspect of the present disclosure relates to a method for making a microelectronic package. The method includes forming a plurality of wire bonds on an in-process unit. The in-process unit includes a substrate having a first surface and a second surface remote therefrom, a plurality of conductive elements exposed at the first surface, and a plurality of metal elements at the surface of the substrate and defined separately from the conductive elements. The formation of at least some of the wire bonds includes joining an end of a metal wire to one of the conductive elements, the end of the metal wire proximate a surface of a bonding tool adjacent an aperture through which the metal wire extends. The formation further includes drawing a predetermined length of the metal wire out from the aperture, and then using the surface of the bonding tool to plastically deform a region of the metal wire between the surface and one of the metal elements. Using the bonding tool, tension is applied to the metal wire to cause a first portion of the metal wire having the end joined to the conductive element to detach from a remaining portion of the metal wire at the plastically deformed region. The first portion forms a wire bond extending from the joined end to a free end of the wire bond remote from the conductive element. A dielectric encapsulation layer is then formed on the in process unit. The encapsulation layer is formed so as to at least partially cover the first surface and portions of the wire bonds such that unencapsulated portions of the wire bonds are defined by at least the ends of the wire bonds that are uncovered by the encapsulation layer.

The method can further include mounting a microelectronic element to the substrate and electrically interconnecting the microelectronic element with at least some of the conductive elements.

In one example, the formation of at least some of the wire bonds can include forming a bend in the wire segment before the step of applying tension. In another example, the first portion of the wire detaching from the remaining portion can form tips of the wire bonds on which the ends are defined. In such an example, the wire bonds can define a first diameter between the bases and the tips, and the tips can have at least one dimension that is smaller than the respective first diameters.

Another aspect of the present disclosure relates to a microelectronic package, including a substrate having a first surface, a plurality of conductive elements at the first surface, and a plurality of metal elements exposed at the first surface and defined separately from the conductive elements. The package further includes a plurality of wire bonds having first ends joined to at least some of the conductive elements and extending away therefrom to respective free ends remote from the conducive elements. A dielectric encapsulation layer at least partially covers the surface of the substrate and completely covers the metal elements. The dielectric encapsulation layer further covers portions of the wire bonds such that unencapsulated portions of the wire bonds are defined by at least the free ends of the wire bonds that are uncovered by the encapsulation layer.

The microelectronic can further include a microelectronic element mounted on the substrate and electrically connected with at least some of the conductive elements.

In an example, at least one of the wire bonds can define an axis between the free end and the base thereof. Such a wire bond can be bent to extend away from the axis on a plane with the entire wire bond being substantially positioned on the plane on a single side of the axis.

At least some of the metal elements can be unitary with at least some of the conductive elements in a plurality of conductive metal pads such that the metal elements are defined separately from the conductive elements by extending beyond portions of the conductive metal pads that are sized to receive the bases of the wire bonds thereon. Additionally or alternatively, the metal elements can be further defined separately from the conductive elements by having a width that is less than a diameter of the conductive elements. At least some of the metal elements can have wire marks thereon. Further, at least some of the wire bonds can include bonding tool marks thereon.

BRIEF DESCRIPTION OF THE DRAWINGS

FIGS. 10A-10C are detail views of various wire bonds that can be fabricated according to a method of the present disclosure and can be included in a microelectronic package similar to that of FIG. 2.

FIG. 11 is a further detail view of a portion of the wire bond shown in FIG. 10A.

DETAILED DESCRIPTION

Figure 1:
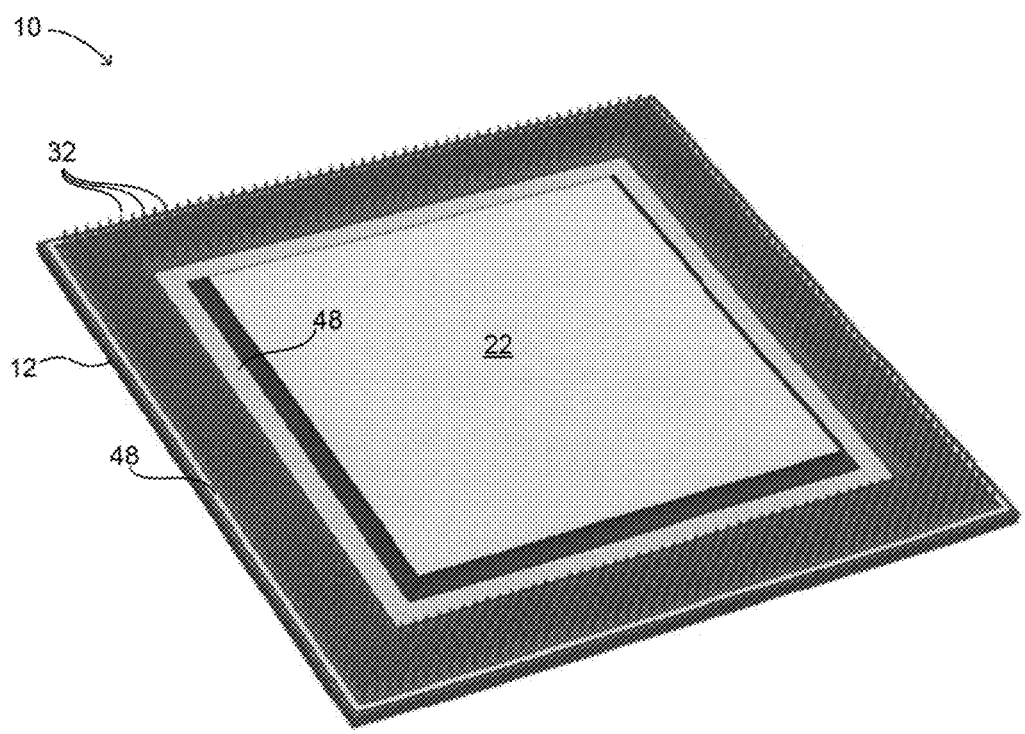
FIG. 1 shows a microelectronic package including a plurality of wire bonds thereon according to an aspect of the present disclosure.

Turning now to the figures, where similar numeric references are used to indicate similar features, there is shown in FIG. 1 a microelectronic assembly 10 according to an embodiment of the present invention. The embodiment of FIG. 1 is a microelectronic assembly in the form of a packaged microelectronic element such as a semiconductor chip assembly that is used in computer or other electronic applications.

Figure 2:
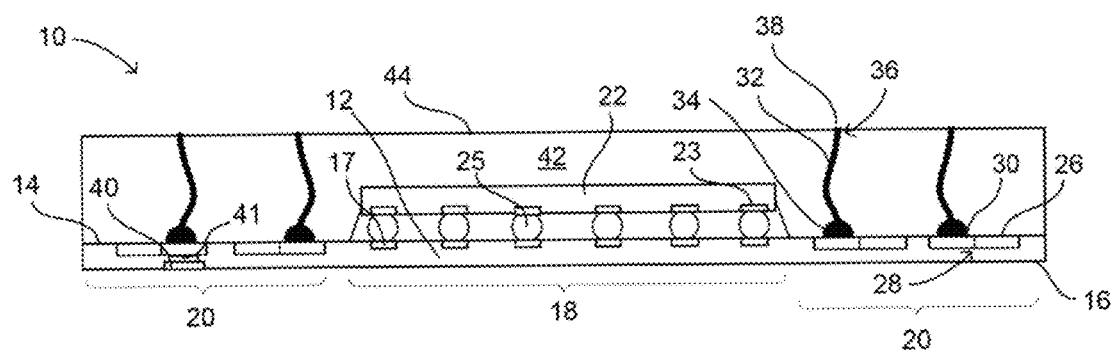
FIG. 2 shows a schematic side view of a microelectronic package similar to that shown in FIG. 1.

The microelectronic assembly 10 of FIGS. 1 and 2 includes a substrate 12 having a first surface 14 and a second surface 16. The substrate 12 typically is in the form of a dielectric element, which is substantially flat. The dielectric element may be sheet-like and may be thin. In particular embodiments, the dielectric element can include one or more layers of organic dielectric material or composite dielectric materials, such as, without limitation: polyimide, polytetrafluoro-ethylene ("PTFE"), epoxy, epoxy-glass, FR-4, BT resin, thermoplastic, or thermoset plastic materials. The first surface 14 and second surface 16 are preferably substantially parallel to each other and are spaced apart at a distance perpendicular to the surfaces 14, 16 defining the thickness of the substrate 12. The thickness of substrate 12 is preferably within a range of generally acceptable thicknesses for the desired application. In an embodiment, the distance between the first surface 14 and the second surface 16 is between about 25 and 500 μm. For purposes of this discussion, the first surface 14 may be described as being positioned opposite or remote from second surface 16. Such a description, as well as any other description of the relative position of elements used herein that refers to a vertical or horizontal position of such elements is made for illustrative purposes only to correspond with the position of the elements within the Figures, and is not limiting.

In an example, substrate 12 is considered as divided into a first region 18 and a second region 20. The first region 18 lies within the second region 20 and includes a central portion of the substrate 12 and extends outwardly therefrom. The second region 20 substantially surrounds the first region 18 and extends outwardly therefrom to the outer edges of the substrate 12. In this embodiment, no specific characteristic of the substrate itself physically divides the two regions; however, the regions are demarked for purposes of discussion herein with respect to treatments or features applied thereto or contained therein.

A microelectronic element 22 can be mounted to first surface 14 of substrate 12 within first region 18. Microelectronic element 22 can be a semiconductor chip or another comparable device. In the embodiment of FIG. 1, microelectronic element 22 is mounted to first surface 14 in what is known as "flip-chip", or face down, configuration, where contacts 23 on the microelectronic element 22 can face and be connected to conductive elements 17 within first region 18 by electrically conductive bumps 25 (e.g., solder bumps, micropillars, or the like) that are positioned beneath microelectronic element 22. In another configuration, a microelectronic element can be mounted face-up on a substrate and can be electrically connected to a conductive feature on the chip by wire leads that extend over an outwardly-facing surface of the substrate. In such an example the wire leads can pass through an opening in the substrate and can be encapsulated by an overmold. In another example, the microelectronic element can be mounted in a conventional or "face-up" fashion. In such a configuration, wire leads (not shown) can be used to electrically connect the microelectronic element to some of a plurality of conductive elements 28 at first surface 14. Such wire leads can also be joined to traces 46 or other conductive features within substrate 12 that are, in turn, connected to conductive elements 28.

Conductive elements 28 are at the first surface 14 of substrate 12 and include respective contact portions 30. As used in the present description, when an electrically conductive element is described as being "at" the surface of another element having dielectric structure, it indicates that the electrically conductive structure is available for contact with a theoretical point moving in a direction perpendicular to the surface of the dielectric structure toward the surface of the dielectric structure from outside the dielectric structure. Thus, a terminal or other conductive structure that is at a surface of a dielectric structure may project from such surface; may be flush with such surface; or may be recessed relative to such surface and exposed through a hole or depression in the dielectric.

Conductive elements 28 can be flat, thin elements in which contact portion 30 is at first surface 14 of substrate 12. Conductive elements 28 can be of a solid metal material such as copper, gold, nickel, or other materials that are acceptable for such an application, including various alloys including one or more of copper, gold, nickel or combinations thereof. In one example, conductive elements 28 can be substantially circular and can be interconnected between each other or to microelectronic element 22 by traces (not shown).

Figure 3:
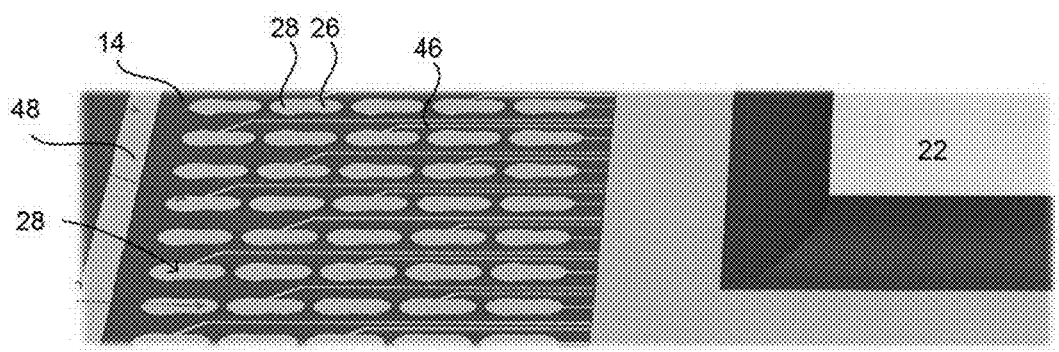
FIG. 3 shows a detail view of the microelectronic package of FIG. 1.

As shown in the detail view of FIG. 3, at least some of the conductive elements 28 can further include a bearing portion 26 that is also at first surface 14 of substrate 12. Bearing portion 26 can be continuous with and extend outwardly from or adjacent to contact portion 30 and can provide an additional metal surface or area for use in the fabrication of additional features of the assembly 10, as will be discussed below. A metal element or bearing portion 26 thus may be unitary with conductive element 28 or contact portion in one conductive metal pad, such that the metal element or bearing portion 26 extends beyond a portion of the conductive metal pad that is sized for joining with the metal wire to form the joined end. The arrangement of both a contact portion 30 and a bearing portion 26 within at least some of the conductive elements 28 can give such conductive elements 28 an oblong shape such as an oval, rounded rectangle, pear or eggplant-shaped configuration. Other shapes and configurations are also possible to carry out the function of bearing portion 26 described below. As a further alternative, some conductive elements 28 can include a bearing portion 26 alone, without a contact portion 30 and can be present at a surface 14 of a substrate 12 that includes other conductive elements 28 with both a contact portion 30 and a bearing portion 26, or a contact portion 30 only.

Conductive elements 28 can be formed at least within second region 20 of substrate 12. Additionally, in certain examples, some conductive elements 17 can also be formed within first region 18. Such an arrangement is particularly useful when mounting microelectronic element 22 in the flip-chip configuration of FIGS. 1 and 2. In such an example, the conductive elements 17 can be without a bearing portion.

At least some of conductive elements 28 can be interconnected to corresponding terminals 40, such as conductive pads, exposed at second surface 16 of substrate 12. Such an interconnection can be completed using vias 41 formed in substrate 12 that can be lined or filled with conductive metal that can be of the same material as conductive elements 28 and terminals 40. Optionally, terminals 40 can be further interconnected by traces on substrate 12.

Microelectronic assembly 10 further includes a plurality of wire bonds 32 joined to at least some of the conductive elements 28 on the contact portions 30 thereof. Wire bonds 32 are joined at a base 34 thereof to the conductive elements 28 and extend to a corresponding free end 36 remote from the base 34 and from substrate 12. The ends 36 of wire bonds 32 are characterized as being free in that they are not connected or otherwise joined to microelectronic element 22 or any other conductive features within microelectronic assembly 10 that are, in turn, connected to microelectronic element 22. In other words, free ends 36 are available for electronic connection, either directly or indirectly as through a solder ball or other features discussed herein, to a conductive feature of a component external to assembly 10, such as, for example, another such assembly 10, a microelectronic element, or a microelectronic package. The fact that ends 36 held in a predetermined position by, for example, encapsulant layer 42 (shown in FIG. 2) or otherwise joined or electrically connected to another external component does not mean that they are not "free". Conversely, base 34 is not free as it is either directly or indirectly electrically connected to microelectronic element 22, as described herein. As shown in FIG. 2, base 34 can be substantially rounded in shape, extending outward from an edge surface (as shown, for example, in FIGS. 10A-C) of wire bond 32 defined between base 34 and end 36. The particular size and shape of base 34 can vary according to the type of material used to form wire bond 32, the desired strength of the connection between wire bond 32 and conductive element 28, or the particular process used to form wire bond 32. Example methods for making wire bonds 32 are and are described in U.S. Pat. No. 7,391,121 to Otremba and in U.S. Pat. App. Pub. Nos. 2012/0280386 ("the '386 Publication") and 2005/0095835 ("the '835 Publication," which describes a wedge-bonding procedure that can be considered a form of wire bonding) the disclosures of which are incorporated herein by reference in their entireties. Alternative configurations are possible where wire bonds 32 are additionally or alternatively joined to conductive elements that are exposed on second surface 16 of substrate 12, extending away therefrom.

Wire bonds 32 can be made from a conductive material such as copper, gold, nickel, solder, aluminum or the like. Additionally, wire bonds 32 can be made from combinations of materials, such as from a core of a conductive material, such as copper or aluminum, for example, with a coating applied over the core. The coating can be of a second conductive material, such as aluminum, nickel or the like. Alternatively, the coating can be of an insulating material, such as an insulating jacket. In an example, the wire used to form wire bonds 32 can have a thickness, i.e., in a dimension transverse to the wire's length, of between about 15 μm and 150 μm. In other examples, including those in which wedge bonding is used, wire bonds 32 can have a thickness of up to about 500 μm. In general, a wire bond is formed on a conductive element, such as conductive element 28 within contact portion 30 using specialized equipment.

As described further below, during formation of a wire bond of the type shown and described herein, a leading end of a wire segment is heated and pressed against the receiving surface to which the wire segment bonds, typically forming a ball or ball-like base 34 joined to the surface of the conductive element 28. The desired length of the wire segment to form the wire bond is drawn out of the bonding tool, which can then cut the wire bond at the desired length. Wedge bonding, which can be used to form wire bonds of aluminum, for example, is a process in which the heated portion of the wire is dragged across the receiving surface to form a wedge that lies generally parallel to the surface. The wedge-bonded wire bond can then be bent upward, if necessary, and extended to the desired length or position before cutting. In a particular embodiment, the wire used to form a wire bond can be cylindrical in cross-section. Otherwise, the wire fed from the tool to form a wire bond or wedge-bonded wire bond may have a polygonal cross-section such as rectangular or trapezoidal, for example.

The free end 36 of wire bond 32 has an end surface 38. End surface 38 can form at least a part of a contact in an array formed by respective end surfaces 38 of a plurality of wire bonds 32. FIG. 1 shows an example pattern for such an array of contacts formed by end surfaces 38. Such an array can be formed in an area array configuration, variations of which could be implemented using the structures described herein. Such an array can be used to electrically and mechanically connect the microelectronic assembly 10 to another microelectronic structure, such as to a printed circuit board ("PCB"), or to other packaged microelectronic elements. In such a stacked arrangement, wire bonds 32 and conductive elements 28 can carry multiple electronic signals therethrough, each having a different signal potential to allow for different signals to be processed by different microelectronic elements in a single stack (in an example, conductive elements 28 can be connected with vias (not shown) that extend through substrate 12 to additional contacts at second surface 16, or conductive elements 28 can be vias themselves). Solder masses can be used to interconnect the microelectronic assemblies in such a stack, such as by electronically and mechanically attaching end surfaces to conductive elements. Examples of stacked configurations using microelectronic assemblies with arrays of exposed ends of wire bonds are shown and described in, for example, the '386 Publication.

Microelectronic assembly 10 further includes an encapsulation layer 42 formed from a dielectric material. As shown in FIG. 2, encapsulation layer 42 extends over the portions of first surface 14 of substrate 12 that are not otherwise covered by or occupied by microelectronic element 22, or conductive elements 28. Similarly, encapsulation layer extends over the portions of conductive elements 28, including bearing portions 26 and areas of contact portions 30 that are not otherwise covered by bases 34 of wire bonds 32. Encapsulation layer 42 can also substantially cover microelectronic element 22, wire bonds 32, including the bases 34 and at least a portion of edge surfaces thereof. A portion of wire bonds 32 can remain uncovered by encapsulation layer 42, which can also be referred to as an unencapsulated portion, thereby making the wire bond available for electrical connection to a feature or element located outside of encapsulation layer 42. In the examples shown in the Figures, a surface, such as major surface 44 of encapsulation layer 42 can be spaced apart from first surface 14 of substrate 12 at a distance great enough to cover microelectronic element 22. Accordingly, examples of microelectronic assembly 10 in which end surface 38 of wire bonds 32 are flush with surface 44, will include wire bonds 32 that are taller than the microelectronic element 22, and any underlying solder bumps for flip chip connection. Other configurations for encapsulation layer 42, however, are possible. For example, the encapsulation layer can have multiple surfaces with varying heights. In such a configuration, the surface 44 within which end surfaces 38 are positioned can be higher or lower than an upwardly facing surface under which microelectronic element 22 is located.

Encapsulation layer 42 serves to protect the other elements within microelectronic assembly 10, particularly wire bonds 32. This allows for a more robust structure that is less likely to be damaged by testing thereof or during transportation or assembly to other microelectronic structures. Encapsulation layer 42 can be formed from a dielectric material with insulating properties such as that described in U.S. Patent App. Pub. No. 2010/0232129, which is incorporated by reference herein in its entirety.

The example of wire bonds 32 shown in FIG. 2, which are shown in further detail in FIGS. 10A and 11, define a particular curved shape that can be imparted on the wire bonds 32 by a process of making the wire bonds 32 that utilizes the bearing portions 26 of the conductive elements 28. Such a method is further described below in connection with FIGS. 4-9. The shape of wire bonds 32 is such that the end surfaces 38 are aligned along an axis 50 with a base end 35 of the wire bond 32 that is immediately adjacent the base 34. In the example of wire bond 32 shown in FIGS. 2 and 10A, the axis is generally perpendicular to the contact portion 30 such that the end surface 38 is positioned directly above the base end 35. Such a configuration can be useful for a plurality of wire bonds 32 in an array wherein the array of connections on major surface 44 of encapsulation layer 42 are intended to have a pitch that generally matches a pitch of the conductive elements 28 to which the wire bonds 32 are respectively joined. In such a configuration, the axis 50 can also be angled with respect to contact portion 30 such that end surface 38 is offset slightly from the base end 35 but is still positioned above base 34. In such an example, the axis 50 can be at an angle of 85° to 90° with respect to contact portion 30.

Wire bond 32 can be configured such that a first portion 52 thereof, on which the end surface 38 is defined, extends generally along a portion of the axis 50. The first portion 52 can have a length that is between about 10% and 50% of the total length of wire bond 32 (as defined by the length of axis 50, for example). A second portion 54 of the wire bond 32 is curved, or bent, so as to extend away from the axis from a location adjacent the first portion 52 to an apex 56 that is spaced apart from the axis 50. The second portion 54 is further curved so as to be positioned along axis 50 at a location at or near base end 35 and to also extend away from the axis 50 to apex 56 from the side of base end 35. It is noted that first portion 52 need not be straight or follow axis 50 exactly and that there may be some degree of curvature or variation therein. It is also noted that there may be abrupt or smooth transitions between first portion 52 and second portion 54 that may themselves be curved. It is noted, however, that the wire bonds 32 depicted in FIGS. 2 and 10A, including second portion 54, are further configured to lie on a single plane on which axis 50 also lies.

Further, both first 52 and second 54 portions of the wire bond 32 are configured such that any portions thereof that do not intersect axis 50 are all on one side of axis 50. That is, some portions of first and second portions 52 and 54 may be, for example, on a side of axis 50 opposite the apex 56 of the curved shape defined by second portion 54; however, any such portions would be in areas of the wire bond 32 that axis 50 intersects at least partially. In other words, first and second portions 52 and 54 of wire bond 32 are configured to not fully cross axis 50 such that the edge surface within those portions is only spaced apart from axis 50 on a single side of axis 50. In the example of FIG. 10A the plane can be along the page on which the illustration of wire bond 32 is presented.

FIGS. 10B and 10C show examples of wire bonds 32 with ends 36 that are not positioned directly above the respective bases 34 thereof. That is, considering first surface 14 of substrate 12 as extending in two lateral directions, so as to substantially define a plane, an end 36 of one of the wire bonds 32 can be displaced in at least one of these lateral directions from a corresponding lateral position of base 34. As shown in FIGS. 10B and 10C, wire bonds 32 can be of the same general shape as the wire bonds of FIG. 10A and can have an end 36 that is aligned with the portion of the wire bond 32 immediately adjacent the base 34 thereof to define an axis 50. The wire bonds 32 can, similarly, include a first portion 52 that extends generally along axis 50 and a second portion 54 that is curved so as to define an apex 56 that is spaced apart from axis 50 on a single side thereof to define a plane that extends along axis 50. The wire bonds 32 of FIGS. 10B and 10C, however, can be configured such that the axis 50, defined as described above, is angled with respect to contact portion 30 at an angle of, for example, less than 85°. In another example, angle 58 can be between about 30° and 75°.

Wire bond 32 can be such that the apex 56 defined within second portion 54 of wire bond can be either exterior to the angle 58, as shown in FIG. 10B, or interior thereto, as shown in FIG. 10C. Further, axis 50 can be angled with respect to contact portion 30 such that end surface 38 of wire bond 32 is laterally displaced relative to contact portion 30 in multiple lateral directions. In such an example, the plane defined by second portion 54 and axis 50 can itself be angled with respect to contact portion 30 and/or first surface 14. Such an angle can be substantially equal to or different than angle 58. That is the displacement of end 36 relative to base 34 can be in two lateral directions and can be by the same or a different distance in each of those directions.

In an embodiment, various ones of wire bonds 32 can be displaced in different directions and by different amounts throughout the assembly 10. Such an arrangement allows for assembly 10 to have an array that is configured differently on the level of surface 44 compared to on the level of substrate 12. For example, an array can cover a smaller overall area or have a smaller pitch on surface 44 compared to that at first surface 14 of substrate 12. Further, some wire bonds 32 can have ends 38 that are positioned above microelectronic element 22 to accommodate a stacked arrangement of packaged microelectronic elements of different sizes. In another example, wire bonds 32 can be configured such that the end 36 of one wire bond 32 is positioned substantially above the base 34 of another wire bond 34, the end 32 of that wire bond 34 being positioned elsewhere. Such an arrangement can be referred to as changing the relative position of a contact end surface 38 within an array of contacts, compared to the position of a corresponding contact array on second surface 16. Within such an array, the relative positions of the contact end surfaces can be changed or varied, as desired, depending on the microelectronic assembly's application or other requirements.

FIGS. 10B and 10C show a further embodiment of a microelectronic subassembly having wire bonds 32 with ends 36 in displaced lateral positions with respect to bases 34. In the embodiment of FIGS. 10B and 10C, the wire bonds 32 achieve this lateral displacement by including a curved portion 54 therein. Curved portion 54 can be formed in an additional step during the wire bond formation process and can occur, for example, while the wire portion is being drawn out to the desired length. This step can be carried out using available wire-bonding equipment, which can include the use of a single machine.

In a variation of the assembly 10 of FIG. 2, wire bonds 32 can be angled as shown in either FIG. 10B, FIG. 10C, or a combination thereof such that at least some of the ends 36 of the wire bonds 32 extend into an area that overlies a major surface 24 of the microelectronic element 22. Such an area can be defined by the outer periphery of microelectronic element 22 and can extend upwardly therefrom.

As shown in FIG. 11, the free ends 36 of at least some of the wire bonds can have an asymmetrical configuration at the end surfaces 38 thereof defined on tips 62 of the wire bonds 32 that are narrower than the adjacent portions of thereof, at least in one direction. The narrow tip 62 of the free end 36 can be imparted on wire bond 32 by a process used for manufacture thereof, an example of which is discussed further below. As shown, the narrow tip 62 can be offset such that an axis 60 through the center thereof is offset from an axis 50 through the center of the adjacent portion of the wire bond 32. Further, a centroid 64 of the end surface 38 can be along axis 60 such that it is offset from the adjacent wire bond portion. The tip 62 of wire bond 32 may also be narrowed in a direction perpendicular to the dimensions shown in FIG. 11 or can be the same width as the adjacent portion of wire bond 32 or can be somewhat wider.

Figure 4:
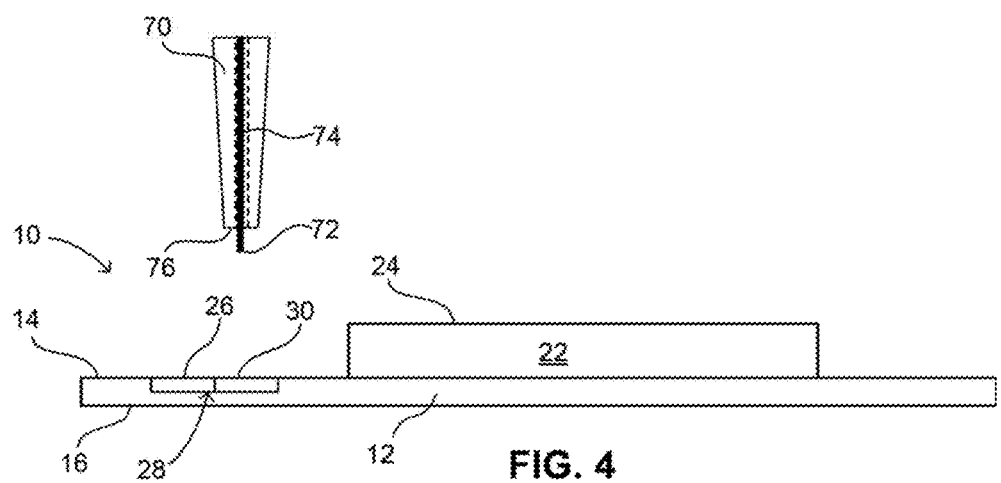
FIGS. 4-9 show a microelectronic package during various steps of a fabrication method according to another aspect of the present disclosure.
Figure 5:
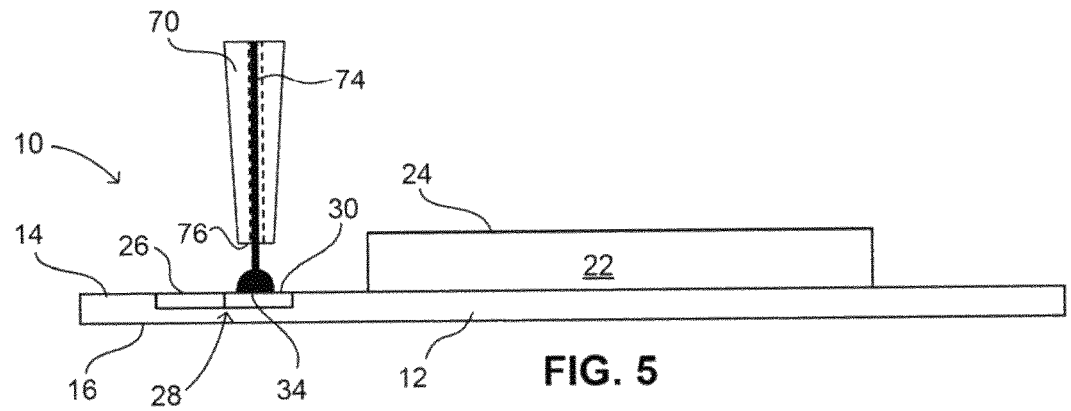
Figure 6:
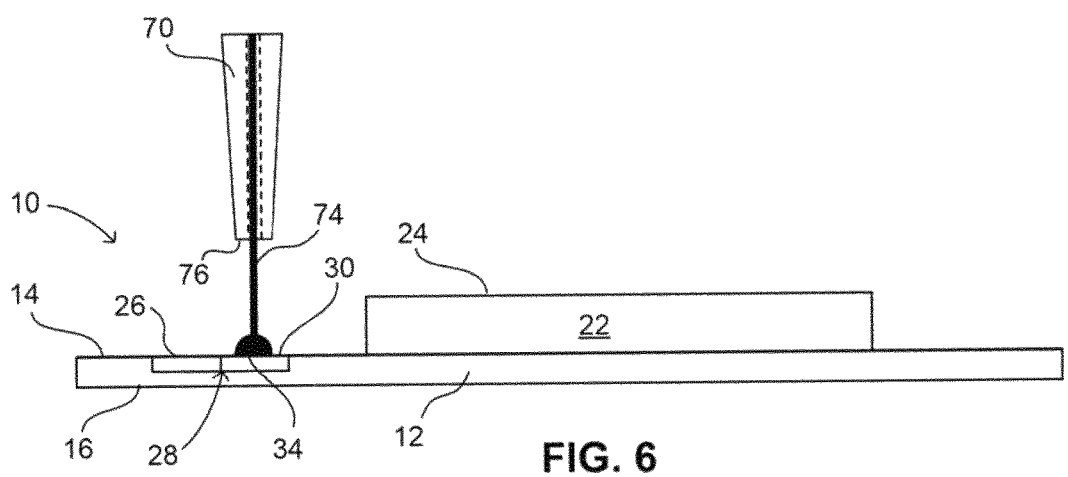

FIGS. 4-9 show a microelectronic assembly 10 in various steps of a fabrication method thereof. FIG. 4 shows microelectronic assembly 10 at a step where microelectronic element 22 has been electrically and mechanically connected to substrate 12 on first surface 14 and within first region 18, thereof, as described above in connection with FIGS. 1 and 2. FIG. 4 further shows a capillary 70 of a wire bonding tool in proximity to the first surface 14 of substrate 12. The capillary 70 shown schematically in FIG. 4, along with the bonding tool (not shown) with which it is associated can be of the type generally described above and can be configured to form a plurality of successive wire bonds in an assembly by heating a leading end 72 of a wire 74 that passes through the capillary 70 and aligning the capillary 70, and accordingly the leading end 72 of the wire 74 with a contact portion 30 of a conductive element 28. In FIG. 4, one conductive metal pad may define a first pair of a conductive element or contact portion 30, and an associated metal element or bearing portion 26. The base 34 of a wire bond is then formed joined to the contact portion 30 by pressing the heated leading end 72 thereagainst by appropriate movement of the capillary 70, as shown in FIG. 5.

Figure 7:
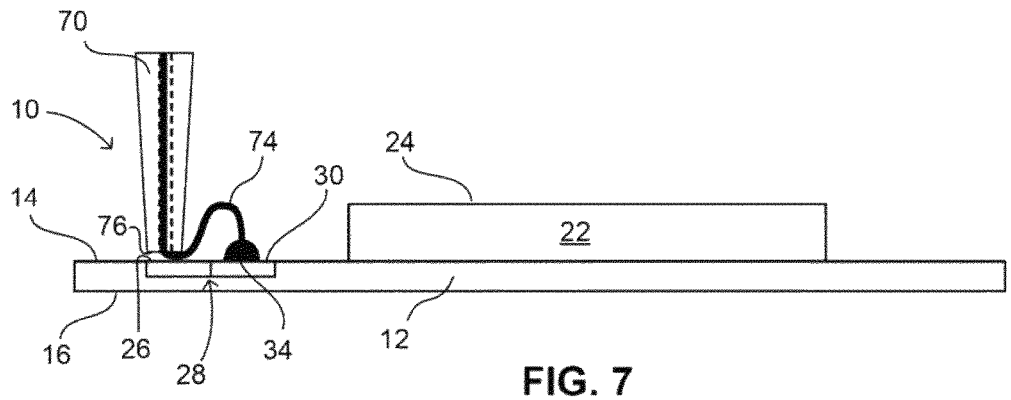

After a desired length of the wire 74 has been drawn out of capillary 70 so as to extend above surface 14 of substrate 12 at an appropriate distance for the height of the wire bond to be formed (FIG. 6), the wire is severed and appropriately positioned. As shown in FIG. 7, the severing and positioning is started by moving capillary 70 to a position over a bearing portion 26 of a conductive element 28. In the example shown in FIG. 7, the capillary 70 is positioned over the bearing portion 26 of the same conductive element to which base 34 is joined within contact portion 30. Other examples are discussed below wherein the capillary 70 is positioned over the bearing portion 26 of another conductive element 28, including a conductive element 28 that includes only a bearing portion 26. After capillary 70 is appropriately positioned, it is pressed toward bearing portion 26 with a portion of the wire 74 between bearing portion 26 and a face 76 of capillary 70 that extends outwardly from wire 74. Pressure is then applied to the wire to move face 76 toward contact portion 30, which compresses wire 74 therebetween, causing plastic deformation of wire 74, e.g., flattening or constriction of the wire, in area 78. Through such deformation, area 78 of wire 74 becomes somewhat weaker than the remaining portions of wire 74 on either side thereof and weaker than the joint between base 34 and contact portion 30. For example, area 78 may be somewhat flattened, constricted, or twisted relative to other portions of the wire 74 on either side thereof.

Figure 8:
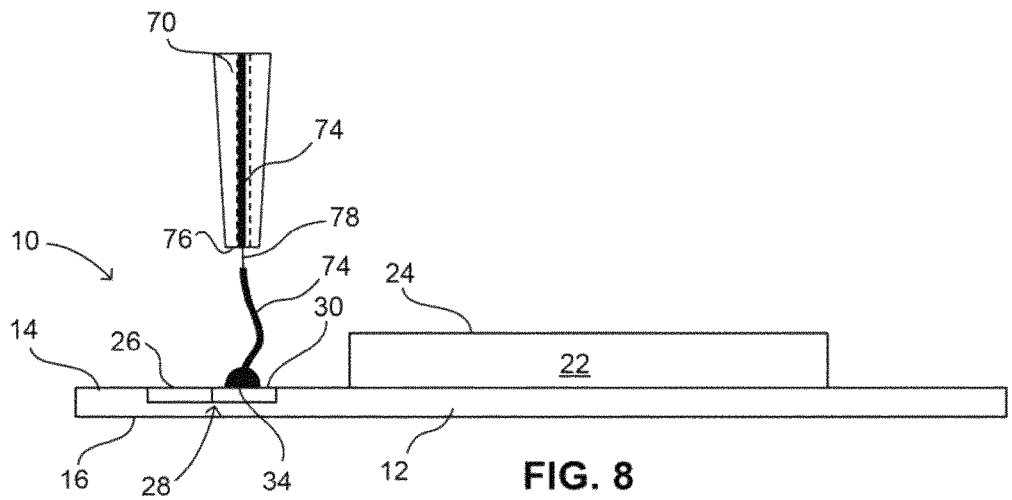

After deformation of area 78 of wire 74, the capillary 70 is then moved back toward a final desired position for the free end 36 of the wire bond 32 to-be formed, as shown in FIG. 8. This position can be directly above base 34, as shown in the example of FIG. 8 or can be laterally displaced therefrom, as discussed above with respect to the examples of FIGS. 10B and 10C. The position of capillary 70 in FIG. 8 can be generally in the desired lateral area of free end 36 and can be just somewhat closer to first surface 14 than the desired final position. Further, as shown in FIG. 8, the wire may remain partially bent, including a shape similar to the shape of the finished wire bonds 32 discussed above including a first portion 52 and second portion 54.

Figure 9:
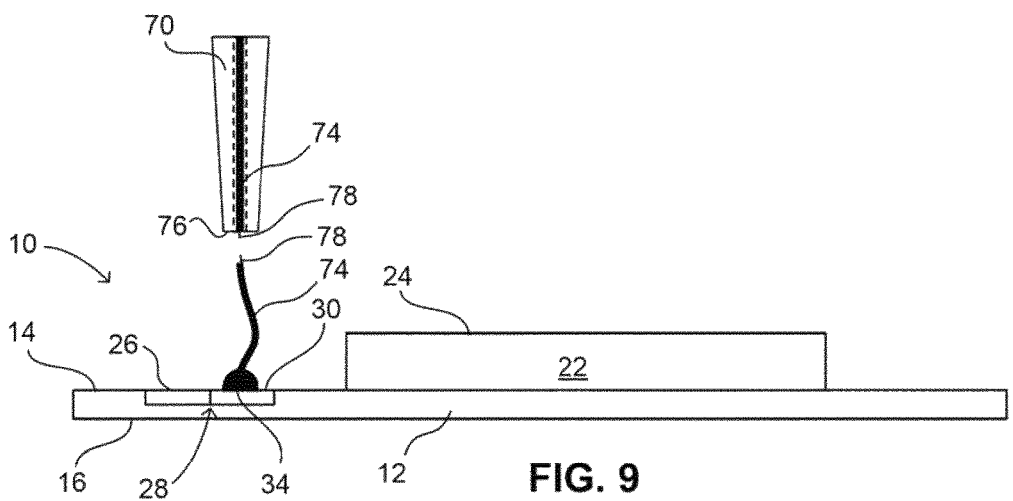

Capillary 70 can then be moved away from surface 14 to apply tension to the segment of wire 74 (which can be clamped or otherwise secured within capillary 70) between capillary 70 and base 34. This tension causes wire 74 to break within area 78, as shown in FIG. 9, which separates wire bond 32 from the remaining portion of wire 74 with a portion of area 78 forming the tip 62 of free end 36 with end surface 38 defined thereon. A remaining portion of area 78 remains on a new leading end of the wire 74. These steps can be repeated on other conductive elements 28 at the surface 14 of the substrate 12 to form an array of wire bonds 32 in a desired pattern.

The use of bearing portions 26 of conductive elements 28 can provide a specific surface on which to form areas 78 of the wire 74 during the formation of wire bonds 32, according to methods such as the one discussed above. The use of the bearing portiond 26 can be beneficial because the metal material from which they are made is harder than the substrate 12 material and, accordingly, less susceptible to damage under the force of capillary 70. Further, by providing designated conductive elements 28 or portions of conductive elements 28 in the form of bearing portions 26, the integrity of the desired contact portions 30 is maintained. For example, the compression of wire 74 against the bearing portions 26 can result in surface scratches thereon, which would potentially adversely affect the strength of the joint between bases 34 and the contact portions 30, if such scratches were present thereon.

In examples where bearing portions 26 of conductive elements 28 are configured for use to compress a portion of a wire 74 thereagainst, as discussed above, the shape of bearing portion 26 can be based on factors involved in such use. For example, the bearing portion 26 can be positioned relative to contact portion 30 to extend away therefrom at a distance sufficient for capillary 70 to move the desired portion of wire 74 into contact therewith at a sufficient distance from base 34 to result in the ultimately-desired height for the wire bond 32. Further, the width of the bearing portion 26 can be sufficient to extend across the width of the wire 74 when in contact therewith. In other words, the bearing portion 26 can be at least as wide as the final width of area 78, which can be influenced by the diameter or gauge of the wire 74.

After formation of the desired number of wire bonds 32, encapsulation layer 42 can be formed by depositing a resin over microelectronic assembly 10. This can be done by placing the assembly 10 in an appropriately configured mold having a cavity in the desired shape of the encapsulation layer 42 that can receive assembly 10. Such a mold and the method of forming an encapsulation layer therewith can be as shown and described in U.S. Pat. App. Pub. No 2010/ 0232129, the disclosure of which is incorporated by reference herein it its entirety. Encapsulation layer can be formed such that, initially, surface 44 thereof is spaced above end surfaces 38 of wire bonds 32. To expose the end surfaces 38, the portion of encapsulation layer 42 that is above end surfaces 38 can be removed, exposing a new surface 44 that is substantially flush with end surfaces 38. Alternatively, encapsulation layer 42 can be formed such that surface 44 is already substantially flush with end surfaces 38 or such that surface 44 is positioned below end surfaces 38. Removal, if necessary, of a portion of encapsulation layer 42 can be achieved by grinding, dry etching, laser etching, wet etching, lapping, or the like. If desired, a portion of the free ends 36 of wire bonds 32 can also be removed in the same, or an additional, step to achieve substantially planar end surfaces 38 that are substantially flush with surface 44.

Figure 12:
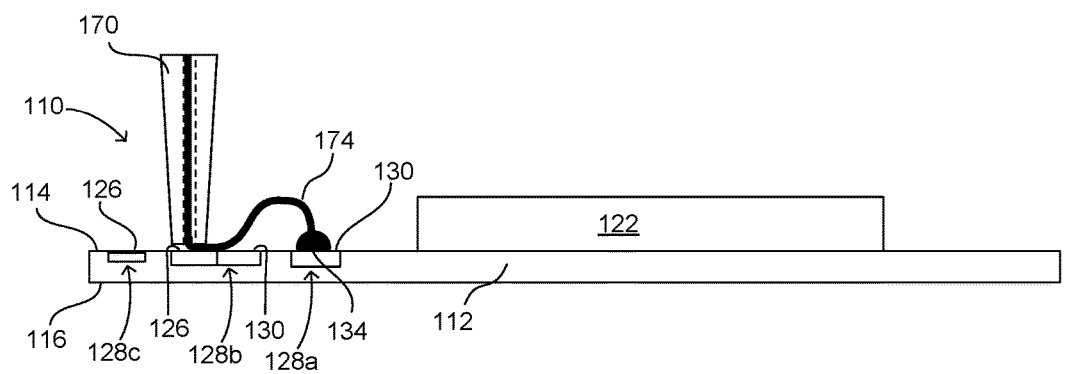
FIGS. 12 and 13 show a microelectronic package during various steps of an alternative fabrication method according to another aspect of the present disclosure.
Figure 13:
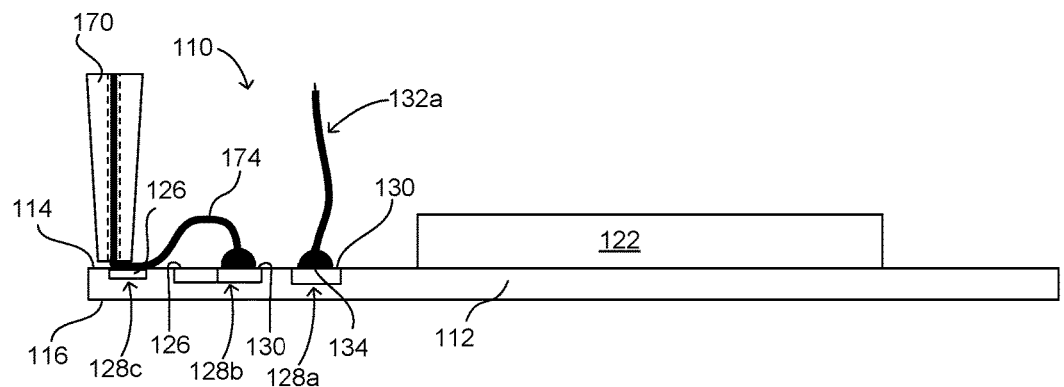

Bearing portions 26 can be used in variations of the wire bond formation method discussed with respect to FIGS. 4-9 to achieve wire bonds 132a of different heights, as shown in FIGS. 12 and 13. In particular, as shown in FIG. 12, a number of different conductive elements 128a, 128b, 128c can be at surface 114 of substrate 112. One or a plurality of each of the different types of conductive elements 128 can be included on substrate 112, depending on the desired configuration of wire bonds 132a and the desired layout or array thereof. In the example shown, some of the conductive elements 128a include only a contact portion 130. Other conductive elements 128b can include both a contact portion 130 and a bearing portion 126 in similar configurations to those discussed above with respect to FIG. 3, for example. Still other conductive elements 128c can include only a bearing portion 126. Such a conductive element 128c can be an appropriately-sized and positioned individual bearing portion 126 that can be similar to the bearing portion 126 shown in FIG. 3, but lacking an attached contact portion 130. Alternatively, such a conductive element 128c can be in the form of a bearing strip 48, an example of which is also shown in FIG. 3. The bearing strip can surround the entire outside area of an array of conductive elements 128 or can extend partially along the outside of such an array or be interspersed therewith.

As further shown in FIG. 12, wire 174 can be joined at its base 134 to conductive element 128a, which includes only a contact portion 130. The same wire 174 can then be compressed, in a manner similar to that which was previously discussed with respect to FIG. 7, against the metal element or bearing portion 126 of a different conductive element 128, such as that of conductive element 128b. Doing so can accommodate a longer length of wire 174 having been drawn out of capillary 170, which can, in turn result in a taller wire bond 132a, as shown in FIG. 13, after wire 174 is severed in a similar manner to that which was discussed above with respect to FIGS. 8 and 9. Similarly, a base 134 can be formed on the contact portion 130 of conductive element 128b, and a segment of the wire 174 can be compressed against conductive element 128c, which includes only a bearing portion 126 to form a wire bond on conductive element 128b of generally the same height as wire bond 132a. For a similar substrate that includes more than two rows of wire bonds, additional conductive elements each of which is a pair of a contact portion or conductive element and a bearing portion or metal element can be included between conductive elements 128c and 128a. In this way, the wire bond forming method may join the metal wire with a conductive element or contact portion of a first pair of a conductive element and a metal element, which may be in place of conductive element 128a, for example, and the method may further include plastically deforming a region of the metal wire between the surface of the bonding tool and another such bearing portion 126 or metal element which is part of a second pair of a conductive element and metal element as shown, for example, in conductive element 128b.

Figure 14:
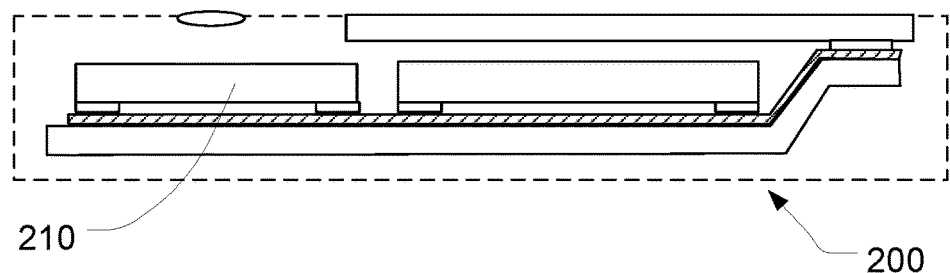
FIG. 14 shows a system that can include a microelectronic package as described herein.

Other arrangements can be made using similar principles. For example, in one embodiment, at least two instances of the step of using the surface of the bonding tool to plastically deform a region of the metal wire may be carried out on the same metal element. FIG. 14 shows a system 200 that can include a microelectronic package 210 as described herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a wire bond having a free end, comprising:
    joining a base end of a metal wire to a conductive element at a surface of a first component, the base end of the metal wire proximate a surface of a bonding tool adjacent an aperture through which the metal wire extends;
    drawing a predetermined length of the metal wire out from the aperture;
    then using the surface of the bonding tool to plastically deform a region of the metal wire between the surface of the bonding tool and a metal element at the surface of the first component; and
    then using the bonding tool to apply tension to the metal wire to cause a first portion of the metal wire having the base end joined to the conductive element to detach from a remaining portion of the metal wire at the plastically deformed region, the first portion forming the wire bond extending from the base end to the free end of the wire bond remote from the conductive element,
    wherein a plurality of conductive elements including the conductive element and a plurality of metal elements including the metal element are at the surface of the first component, the conductive elements and the metal elements being arranged in pairs along the surface, and wherein the conductive element with which the wire bond is joined is in a first one of the pairs.

2. The method of claim 1, wherein the metal element is a portion of a conductive circuit structure included within the first component.

3. The method of claim 2, wherein the portion of the conductive circuit structure is selected from at least one of a trace, a pad, a plating line, a power plane, and a ground plane.

4. The method of claim 1, wherein the bonding tool is a capillary and the surface of the bonding tool is a face of the capillary.

5. The method of claim 1, wherein the bonding tool is a bonding wedge and the surface of the bonding tool is a face of the bonding wedge.

6. The method of claim 1, further comprising moving the bonding tool to a position over the metal element such that a portion of the length of metal wire is between the surface of the bonding tool and the metal element, the moving of the bonding tool forming a first bend in the portion of the metal wire between the surface of the bonding tool and the base end.

7. The method of claim 6, further comprising, after using the surface of the bonding tool to plastically deform the region of the metal wire, moving the bonding tool to a predetermined position approximating a desired position of the free end of the wire bond, thereby forming a second bend in the portion of the metal wire adjacent the base end.

8. The method of claim 6, wherein the step of applying tension causes at least partial straightening of the first bend.

9. The method of claim 1, wherein using the surface of the bonding tool to plastically deform the region of the metal wire and applying tension impart a shape on the wire bond such that the wire bond defines an axis between the free end and the base end, the wire bond being bent to extend away from the axis on a plane, the wire bond being substantially positioned on the plane on a single side of the axis.

10. The method of claim 1, wherein the metal element is unitary with the conductive element in a conductive metal pad, the metal element being defined separately from the conductive element by extending beyond a portion of the conductive metal pad that is sized for joining with the metal wire to form the base end.

11. The method of claim 10, wherein the metal element is further defined separately from the conductive element by having a width that is less than a diameter of the conductive element.

12. The method of claim 1, wherein the metal element against which the metal wire is plastically deformed is the metal element of the first pair.

13. The method of claim 12, wherein the metal element against which the metal wire is plastically deformed is the metal element of a second pair.

14. The method of claim 1, wherein using the surface of the bonding tool to plastically deform the region of the metal wire creates wire marks on the metal element.

15. The method of claim 1, wherein using the surface of the bonding tool to plastically deform the region of the metal wire creates bonding tool marks within the plastically deformed region of the metal wire.

16. The method of claim 1, wherein the plastically deformed region of the metal wire defines a first axis that is displaced from a second axis of an adjacent portion of the metal wire in at least one direction.

17. The method of claim 1, wherein a first surface portion of the metal wire is compressed in a first direction by the surface of the bonding tool.

18. The method of claim 17, wherein a second surface portion of the metal wire is compressed in a second direction by the metal element.

19. The method of claim 1, wherein the conductive element is one of the plurality of conductive elements at the surface of the first component and the metal element is one of the plurality of metal elements at the surface of the first component, and wherein after the step of applying tension has detached the first portion of the metal wire from the remaining portion, the remaining portion of the metal wire defines an end of the metal wire, the method further comprising repeating the steps of joining, drawing, plastically deforming, and applying tension to form a plurality of wire bonds extending away from at least some of the plurality of conductive elements to respective free ends remote from the plurality of conductive elements.

20. The method of claim 19, further comprising forming a dielectric encapsulation layer at least partially covering the surface of the first component and portions of the wire bonds, such that unencapsulated portions of the wire bonds are defined by at least the free ends of the wire bonds that are uncovered by the encapsulation layer.

21. The method of claim 19, wherein at least two instances of the step of using the surface of the bonding tool to plastically deform the region of the metal wire are performed using the same metal element.

22. The method of claim 19, wherein at least some of the plurality of conductive elements and the plurality of metal elements are arranged in an array of the pairs of the metal elements and the conductive elements, the array having a predetermined number of rows, and wherein an instance of the step of joining is carried out on one of the plurality of conductive elements in a first one of the rows and the corresponding step of using the surface to plastically deform the region of the metal wire is carried out on one of the metal elements in a second one of the rows.

23. A method for making a microelectronic package, comprising:
  forming a plurality of wire bonds on an in-process unit including a substrate having a first surface and a second surface remote therefrom, a plurality of conductive elements exposed at the first surface, and a plurality of metal elements at the first surface and defined separately from the conductive elements, the conductive elements and the metal elements being arranged in pairs along the first surface, the formation of at least some of the wire bonds including:
    joining a base end of a metal wire to one of the conductive elements, the base end of the metal wire proximate a surface of a bonding tool adjacent an aperture through which the metal wire extends;
    drawing a predetermined length of the metal wire out from the aperture;
    then using the surface of the bonding tool to plastically deform a region of the metal wire between the surface of the bonding tool and one of the metal elements; and
    then using the bonding tool to apply tension to the metal wire to cause a first portion of the metal wire having the base end joined to the conductive element to detach from a remaining portion of the metal wire at the plastically deformed region, the first portion forming one of the wire bonds extending from the base end to a free end of the one of the wire bonds remote from the one of the conductive elements,
  wherein a first one of the conductive elements with which a first one of the wire bonds is joined is in a first one of the pairs; and
  forming a dielectric encapsulation layer on the in-process unit, wherein the encapsulation layer is formed at least partially covering the first surface and portions of the wire bonds, such that unencapsulated portions of the wire bonds are defined by at least the free ends of the wire bonds that are uncovered by the encapsulation layer.

* * * * *